United States Patent
Tae et al.

(10) Patent No.: US 7,652,449 B2
(45) Date of Patent: Jan. 26, 2010

(54) BATTERY MANAGEMENT SYSTEM AND DRIVING METHOD THEREOF

(75) Inventors: Yong-Jun Tae, Suwon-si (KR);
Soo-Seok Choi, Suwon-si (KR);
Young-Jo Lee, Suwon-si (KR);
Han-Seok Yun, Suwon-si (KR);
Se-Wook Seo, Suwon-si (KR);
Gye-Jong Lim, Suwon-si (KR);
Beom-Gyu Kim, Suwon-si (KR);
Ho-Young Park, Suwon-si (KR)

(73) Assignee: Samsung SDI Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 11/902,337

(22) Filed: Sep. 20, 2007

(65) Prior Publication Data
US 2008/0224709 A1    Sep. 18, 2008

(30) Foreign Application Priority Data
Sep. 26, 2006    (KR) .................. 10-2006-0093589

(51) Int. Cl.
*H02J 7/00* (2006.01)
*G01R 31/36* (2006.01)
*H02H 7/18* (2006.01)

(52) U.S. Cl. .................. 320/104; 320/134; 320/137; 702/63; 307/10.7

(58) Field of Classification Search .................. 320/134, 320/104, 137, 127; 307/10.7, 149, 150; 702/63; 324/426, 433
See application file for complete search history.

(56) References Cited

U.S. PATENT DOCUMENTS

| 5,153,496 A | 10/1992 | LaForge |
| 5,321,627 A | 6/1994 | Reher |
| 5,666,040 A | 9/1997 | Bourbeau |
| 5,701,068 A | 12/1997 | Baer et al. |
| 5,773,959 A | 6/1998 | Merritt et al. |

(Continued)

FOREIGN PATENT DOCUMENTS

| CN | 1415973 A | 5/2003 |
| CN | 1604383 A | 4/2005 |
| EP | 0990913 A1 | 4/2000 |
| EP | 1081499 A1 | 3/2001 |
| EP | 1203964 A2 | 5/2002 |

(Continued)

OTHER PUBLICATIONS

State of charge (Wikipedia—2 pages) print out from http://en.wikipedia.org/wiki/State_of_charge.
Custom Power Solutions (10 pages) print out from http://www.mpoweruk.com/soc.htm.

*Primary Examiner*—Edward Tso
*Assistant Examiner*—Alexis Boateng
(74) *Attorney, Agent, or Firm*—Robert E. Bushnell, Esq.

(57) ABSTRACT

In a battery management system and a driving method thereof, the system includes a sensor and a micro control unit (MCU). The sensor senses a voltage and a current of a battery, and generates an estimation current of the battery using a result of cumulatively calculating the battery current by a unit of a predetermined period. The MCU receives the battery voltage and the estimation current, sets a voltage of the battery in a key-on state as a first voltage, sets a voltage of the battery after a first period as a second voltage, and calculates an internal resistance of the battery using a difference between the first and second voltages and an average value of the estimation current.

12 Claims, 4 Drawing Sheets

U.S. PATENT DOCUMENTS

| | | | |
|---|---|---|---|
| 5,773,962 | A | 6/1998 | Nor |
| 5,796,334 | A | 8/1998 | Chen et al. |
| 5,952,815 | A | 9/1999 | Rouillard et al. |
| 6,014,013 | A | 1/2000 | Suppanz et al. |
| 6,078,165 | A | 6/2000 | Ashtiani et al. |
| 6,104,166 | A | 8/2000 | Kikuchi et al. |
| 6,127,806 | A | 10/2000 | Tanjo et al. |
| 6,157,169 | A | 12/2000 | Lee |
| 6,255,826 | B1 | 7/2001 | Ohsawa et al. |
| 6,300,763 | B1 | 10/2001 | Kwok |
| 6,336,063 | B1 | 1/2002 | Lennevi |
| 6,377,030 | B1 | 4/2002 | Asao et al. |
| 6,411,063 | B1 | 6/2002 | Kouzu et al. |
| 6,472,880 | B1 | 10/2002 | Kang |
| 6,621,250 | B1 | 9/2003 | Ohkubo et al. |
| 6,639,409 | B2 | 10/2003 | Morimoto et al. |
| 6,803,766 | B2 | 10/2004 | Kobayashi et al. |
| 7,126,342 | B2 | 10/2006 | Iwabuchi et al. |
| 2001/0035737 | A1 | 11/2001 | Nakanishi et al. |
| 2002/0030494 | A1 | 3/2002 | Araki et al. |
| 2002/0113595 | A1 | 8/2002 | Sakai et al. |
| 2003/0025481 | A1 | 2/2003 | Bertness |
| 2003/0146737 | A1 | 8/2003 | Kadouchi et al. |
| 2003/0189419 | A1 | 10/2003 | Maki et al. |
| 2004/0109274 | A1 | 6/2004 | Sato |
| 2005/0156603 | A1 | 7/2005 | Lin et al. |
| 2005/0269991 | A1* | 12/2005 | Mitsui et al. ............... 320/132 |
| 2006/0028179 | A1 | 2/2006 | Yudahira et al. |
| 2006/0181245 | A1 | 8/2006 | Mizuno et al. |
| 2006/0202663 | A1 | 9/2006 | Cho et al. |
| 2007/0090802 | A1 | 4/2007 | Seo |
| 2007/0090803 | A1 | 4/2007 | Yun et al. |
| 2008/0077339 | A1 | 3/2008 | Seo et al. |
| 2008/0091364 | A1 | 4/2008 | Lim et al. |

FOREIGN PATENT DOCUMENTS

| | | |
|---|---|---|
| EP | 1841003 A1 | 10/2007 |
| JP | 06231806 | 8/1994 |
| JP | 11160367 | 6/1999 |
| JP | 2000-069606 | 3/2000 |
| JP | 2000-134705 | 5/2000 |
| JP | 2000-217261 | 8/2000 |
| JP | 2000-228832 | 8/2000 |
| JP | 2000-324702 | 11/2000 |
| JP | 2000-340267 | 12/2000 |
| JP | 2000-357541 | 12/2000 |
| JP | 2001-086656 | 3/2001 |
| JP | 2001-116776 | 4/2001 |
| JP | 2002042906 | 2/2002 |
| JP | 2002-199510 | 7/2002 |
| JP | 2003-084015 | 3/2003 |
| JP | 2003134675 | 5/2003 |
| JP | 2004079324 | 3/2004 |
| JP | 2004-180397 | 6/2004 |
| JP | 2004-222433 | 8/2004 |
| JP | 2005-269752 | 9/2005 |
| JP | 2006-014480 | 1/2006 |
| JP | 2006-047130 | 2/2006 |
| KR | 19920009697 | 9/1989 |
| KR | 10-1997-0048597 | 7/1997 |
| KR | 1998064646 | 10/1998 |
| KR | 10-0216808 | 6/1999 |
| KR | 10-2001-0043872 | 5/2001 |
| KR | 10-2001-0107687 | 12/2001 |
| KR | 20020064998 | 8/2002 |
| KR | 2003-0065757 A | 8/2003 |
| KR | 20040005133 A | 1/2004 |
| KR | 20040092943 | 11/2004 |
| KR | 20040111144 | 12/2004 |
| KR | 10-2005-0019856 | 3/2005 |
| KR | 20050026360 A | 3/2005 |
| KR | 20050089816 | 9/2005 |
| KR | 10-0534818 | 12/2005 |
| KR | 2006-0059680 A | 6/2006 |
| KR | 2006-0079505 A | 7/2006 |
| KR | 2006-0094897 A | 8/2006 |
| KR | 20070003628 A | 1/2007 |
| KR | 20070029937 A | 3/2007 |
| WO | WO 99/61929 | 12/1999 |
| WO | WO 2004/008166 | 1/2004 |
| WO | 2007007655 | 1/2007 |

* cited by examiner

BATTERY MANAGEMENT SYSTEM AND DRIVING METHOD THEREOF

CLAIM OF PRIORITY

This application makes reference to, incorporates the same herein, and claims all benefits accruing under 35 U.S.C.§119 from an application for BATTERY MANAGEMENT SYSTEM AND DRIVING METHOD THEREOF earlier filed in the Korean Intellectual Property Office on the 26 day of Sep. 2006 and there duly assigned Serial No. 10-2006-0093589.

BACKGROUND OF THE INVENTION

1. Technical Field

The present invention relates to a battery management system. More particularly, the present invention relates to a battery management system used in a vehicle using electrical energy, and a driving method thereof.

2. Related Art

A vehicle using an internal combustion engine, and using gasoline or heavy oil as a main fuel, has a serious influence on the generation of environmental pollution, such as air pollution. In recent years, much effort has been made to develop an electric vehicle or a hybrid vehicle so as to reduce the generation of environmental pollution.

The electric vehicle is a vehicle which uses a battery engine which operates by means of electrical energy output from a battery. The electric vehicle uses a battery in which a plurality of rechargeable secondary cells is provided as one pack and as its main power source. Thus, the electric vehicle has advantages in that there is no discharge gas, and the noise is very small.

The hybrid vehicle is an intermediary vehicle between the vehicle using an internal combustion engine and the electric vehicle. The hybrid vehicle uses two or more power sources, for example, an internal combustion engine and a battery engine. At present, a hybrid vehicle which uses an internal combustion engine and a fuel cell for continuously supplying hydrogen and oxygen while inducing a chemical reaction to directly obtain electrical energy, or which uses a battery and a fuel cell, is being developed.

In the vehicle using the battery engine, secondary battery cells are increasing in number so as to improve the power source, and a plurality of connected cells have a direct influence on the performance of the vehicle. Thus, there is a requirement for a battery management system (BMS) in which each battery cell should not only be excellent in performance, but also a BMS in which the voltage of each battery cell and the voltage and current of the entire battery are measured, and charge and discharge of each battery cell is effectively managed.

In particular, the internal resistance of the battery has a direct relation to an output reduction and a fatigue state of the battery, and it is used as a reference for determining the lifespan and the state of health (SOH) of the battery. Thus, there is a requirement to more accurately measure the internal resistance of the battery so as to determine the lifespan and the SOH of the battery having the direct influence on the performance of the vehicle.

The information disclosed above is only for enhancement of an understanding of the invention, and thus it does not necessarily form the prior art already known to a person of ordinary skill in the art.

SUMMARY OF THE INVENTION

The present invention has been made in an effort to provide a battery management system and a driving method thereof having the advantage of more accurately calculating an internal resistance of a battery.

An exemplary embodiment of the present invention provides a battery management system which includes a sensor and a micro control unit (MCU). The sensor senses a voltage and a current of a battery, and generates an estimation current of the battery using a result of cumulatively calculating the battery current by a unit of a predetermined period. The MCU receives the battery voltage and estimation current, sets a voltage of the battery in a key-on state as a first voltage, sets a voltage of the battery after a first period as a second voltage, and calculates an internal resistance of the battery using the difference between the first and second voltages and an average value of the estimation current. The estimation current is generated by cumulatively calculating the battery current by a unit of a second period, and dividing the calculated result by a time corresponding to the second period. The MCU samples the battery estimation current of the first period, and calculates the average value of the estimation current. The MCU calculates the battery internal resistance using the following equation:

$$Rb = \frac{V_2 - V_1}{I_{ave}} \times 1000 \ [m\Omega]$$

where $V_1$ is the battery voltage in the key-on state, $V_2$ is the battery voltage after the first period, and $I_{ave}$ is the average value of the estimation current.

The sensor includes an electric current estimator for comparing the battery current with a reference current, cumulatively calculating a deviation based on the comparison result, dividing the calculated result by the time corresponding to the second period, and generating the estimation current.

Another embodiment of the present invention provides a method for driving a battery management system managing a battery. The method includes: setting a voltage of the battery in a key-on state as a first voltage; setting a voltage of the battery after a first period as a second voltage; calculating an average value of an estimation current of the battery of the first period; and calculating an internal resistance of the battery using a difference between the first and second voltages and the average value of the estimation current. The calculation of the average value includes: cumulatively calculating the battery current by a unit of a second period, dividing the calculated result by a time corresponding to the second period, and generating the estimation current of the battery. The calculation of the average value of the estimation current is performed by sampling the battery estimation current of the first period. The calculation of the internal resistance is performed using the following equation:

$$Rb = \frac{V_2 - V_1}{I_{ave}} \times 1000 \; [m\Omega]$$

where $V_1$ is the battery voltage in the key-on state,
$V_2$ is the battery voltage after the first period, and
$I_{ave}$ is the average value of the estimation current.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
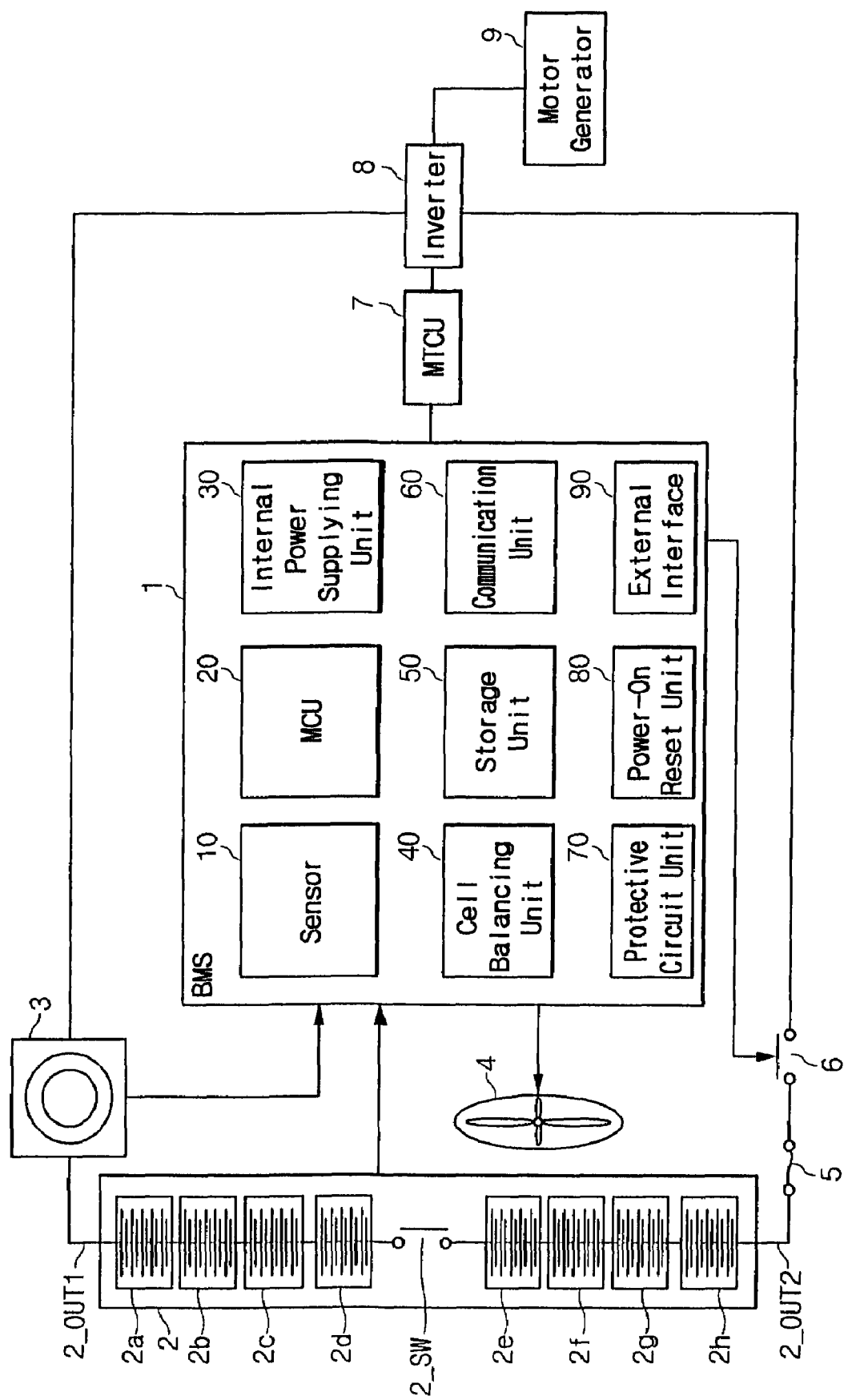
FIG. 1 is a schematic diagram illustrating a battery, a battery management system (BMS), and a peripheral device of the BMS according to an exemplary embodiment of the present invention.

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the entire specification, "connecting" any part with another part not only includes "directly connecting", but also includes "electrically connecting" with a different constituent element interposed therebetween. Also, "including" a constituent element in a part signifies further including, not excluding, another constituent element if there is no specific reference to the contrary.

FIG. 1 is a schematic diagram illustrating a battery, a battery management system (BMS), and a peripheral device of the BMS according to an exemplary embodiment of the present invention.

As shown in FIG. 1, a vehicle system includes the BMS 1, the battery 2, an electric current sensor 3, a cooling fan 4, a fuse 5, a main switch 6, a motor control unit (MTCU) 7, an inverter 8, and a motor generator 9.

The battery 2 includes: a plurality of sub-packs 2a to 2h in which a plurality of battery cells are coupled in series; output terminals (2_OUT1 and 2_OUT2); and a safety switch (2_SW) provided between the sub-pack 2d and the sub-pack 2e. The sub-packs 2a to 2h are exemplarily eight in number indicating the plurality of battery cells in one group, and are not intended to limit the scope of the present invention. The safety switch (2_SW) refers to a switch provided between the sub-pack 2d and the sub-pack 2e. The safety switch (2_SW) can be manually switched on/off for the sake of a worker's safety when the battery is replaced or when work on the battery is being carried out. In an exemplary embodiment of the present invention, the safety switch (2_SW) is provided between the sub-pack 2d and the sub-pack 2e, but it is not intended to limit the scope of the present invention. The output terminals (2_OUT1 and 2_OUT2) are connected to the inverter 8 through electric current sensor 3 and through fuse 5 and switch 6, respectively.

The electric current sensor 3 measures the amount of electric current output from the battery 2, and outputs the measured current amount to a sensor 10 of the BMS 1. The electric current sensor 3 can be a Hall current transformer (CT) for measuring the current using a Hall device and outputting an analog current signal associated with the measured current, or a shunt resistor for outputting a voltage signal corresponding to an electric current flowing through a resistor inserted into a load line.

The cooling fan 4 dissipates heat caused by charge and discharge of the battery 2 on the basis of a control signal of the BMS 1, thereby preventing the battery 2 from being degenerated due to an increase in temperature, and preventing efficiency of the charge and discharge from being reduced.

The fuse 5 disconnects or short-circuits the battery 2, thereby preventing an overcurrent from being transmitted to the battery 2. In other words, when an overcurrent is generated, the fuse 5 is disconnected, thereby preventing the overcurrent from being transmitted to the battery 2.

When an abnormal overvoltage, overcurrent, or high temperature occurs, the main switch 6 switches on/off the battery 2 on the basis of a control signal from the BMS 1 or the MTCU 7 of the vehicle.

The BMS 1 includes the sensor 10, a Micro Control Unit (MCU) 20, an internal power supplying unit 30, a cell balancing unit 40, a storage unit 50, a communication unit 60, a protective circuit 70, a power-on reset unit 80, and an external interface 90.

The sensor 10 senses and transmits a battery voltage, a battery current, and a battery temperature to the MCU 20.

The MCU 20 estimates a state of charge (SOC) and a state of health (SOH) of the battery 2 using the battery voltage, the battery current, and the battery temperature received from the sensor 10, and controls the charge and discharge of the battery 2. Particularly, the MCU 20 calculates the internal resistance of the battery 2, and determines the life span and the SOH of the battery 2 using the calculated internal resistance of the battery 2. Since the internal resistance has a close connection to the output reduction and the fatigue state of the battery 2, it can be a reference for determining the lifespan and the SOH of the battery 2. While the vehicle runs, it is difficult to detect a time point where an open circuit voltage (OCV) is detected, and the electric current suddenly varies. Therefore, the MCU 20 calculates the internal resistance of the battery 2 soon after the key-on state. Factors necessary for calculating the internal resistance of the battery 2 are the battery voltage ($V_1$) soon after the key-on state, the battery voltage ($V_2$) measured after a first period for which the battery 2 is charged or discharged, and an average value ($I_{ave}$) of an estimation current flowing through the battery 2 for the first period. According to an exemplary embodiment of the present invention, the first period refers to a period arbitrarily set among a battery charge or discharged period after the key-on state. The first period can be set according to a condition for controlling the vehicle. For example, according to the condition for controlling the vehicle, the vehicle is operated by only a gasoline engine for a prescribed period after the key-on-state. Then, the first period is set to be below the prescribed period. In detail, the MCU 20 sets a voltage received from the sensor 10 soon after the key-on state, as the battery voltage ($V_1$) of the key-on state, in order to calculate the internal resistance of the battery 2. The MCU 20 sets a voltage, received from the sensor 10 after the first period for which the battery 2 is charged or discharged, as the battery voltage ($V_2$). The MCU 20 calculates a difference ($V_2-V_1$) between the battery voltage ($V_2$) after the first period and the battery voltage ($V_1$) of the key-on state. The MCU 20 calculates the average value ($I_{ave}$) of the estimation current of the battery 2, using the estimation current (i) flowing through the battery 2 for the first period for which the battery 2 is charged or discharged. The MCU 20 divides the calculated voltage difference ($V_2-V_1$) by the average value ($I_{ave}$) of the estimation current of the battery 2, calculates the internal resistance of the battery 2, and determines the lifespan and the SOH of the battery 2 using the calculated internal resistance of the battery 2. According to an exemplary embodiment of the present invention, the battery management system compares a presently measured battery current with a reference current, and cumulatively calculates a deviation between the battery current and the reference current by a unit of a second period. The estimation current is an electric current calculated by dividing the cumulatively calculated result by a time corresponding to the second period. The second period refers to a time period for which a variation of the battery current is measured. As the time corresponding to the second period gets shorter, the battery current can be more accurately measured.

The internal power supplying unit 30 supplies power to the BMS 1 using a sub battery. The cell balancing unit 40 balances the state of charge of each cell. In other words, the cell balancing unit 40 can discharge a cell having a relatively high charged state, and can charge a cell having a relatively low charged state. The storage unit 50 stores data of the SOC and SOH when the BMS 1 is in a power-off state. The storage unit 50 can be a nonvolatile storage unit which is an electrically erasable programmable read only memory (EEPROM). The communication unit 60 communicates with the MTCU 7 of the vehicle. The communication unit 60 transmits information on the SOC and the SOH from the BMS 1 to the MTCU 7, or receives information on the vehicle state from the MTCU 7 and transmits the received information to the MCU 20. The protective circuit 70 refers to a secondarily added circuit to protect the battery 2 from overcurrent and overvoltage using hardware. Before that, the protective circuit 70 primarily protects the battery 2 using firmware provided within the MCU 20. The power-on reset unit 80 resets the entire system when the BMS 1 is in a power-on state. The external interface 90 connects sub devices of the BMS 1, such as the cooling fan 4 and the main switch 6, to the MCU 20. In an exemplary embodiment of the present invention, only the cooling fan 4 and the main switch 6 are shown, but this is not intended to limit the scope of the present invention.

The MTCU 7 detects an in-running state of the vehicle on the basis of information on the accelerator, the brake, and the speed of the vehicle, and determined necessary information such as the degree of torque. The in-running state of the vehicle refers to the key-on state for starting the engine, a key-off state for stopping the engine, a coasting state, and an acceleration running state. The MTCU 7 transmits the information on the vehicle state to the communication unit 60 of the BMS 1. The MTCU 7 controls the motor generator 9 so that it has an output based on torque information. In other words, the MTCU 7 controls switching of the inverter 8, and controls the motor generator 9 to have an output based on the torque information. The MTCU 7 receives the SOC of the battery 2 from the MCU 20 through the communication unit 60 of the BMS 1, and controls the SOC of the battery 2 to reach a target value (e.g., 55%). For example, receiving an SOC of 55% or less from the MCU 20, the MTCU 7 controls a switch of the inverter 8 to output power toward the battery 2, thereby charging the battery 2. At this time, the battery current can be set to a positive (+) value. Receiving an SOC of 55% or more, the MTCU 7 controls the switch of the inverter 8 to output the power toward the motor generator 9, thereby discharging the battery 2. At this time, the battery current can be set to a negative (−) value.

The inverter 8 enables the battery 2 to be charged or discharged on the basis of the control signal of the MTCU 7.

The motor generator 9 uses the electrical energy of the battery 2 to drive the vehicle on the basis of the torque information received from the MTCU 7.

As a result, the MTCU 7 charges and discharges the battery 2 as much as a rechargeable power on the basis of the SOC, thereby preventing the battery 2 from being overcharged and over discharged, and making it possible to efficiently use the battery 2 for a long time. However, when the battery 2 is installed in the vehicle, it is difficult to measure the actual SOC of the battery 2. Therefore, the BMS 1 should accurately estimate the SOC, using the battery current, the battery voltage, and the cell temperature sensed in the sensor 10, and transmit the estimated SOC to the MTCU 7.

A method for calculating the internal resistance of the battery according to an exemplary embodiment of the present invention will be described in detail with reference to FIGS. 2 and 3.

Figure 2:
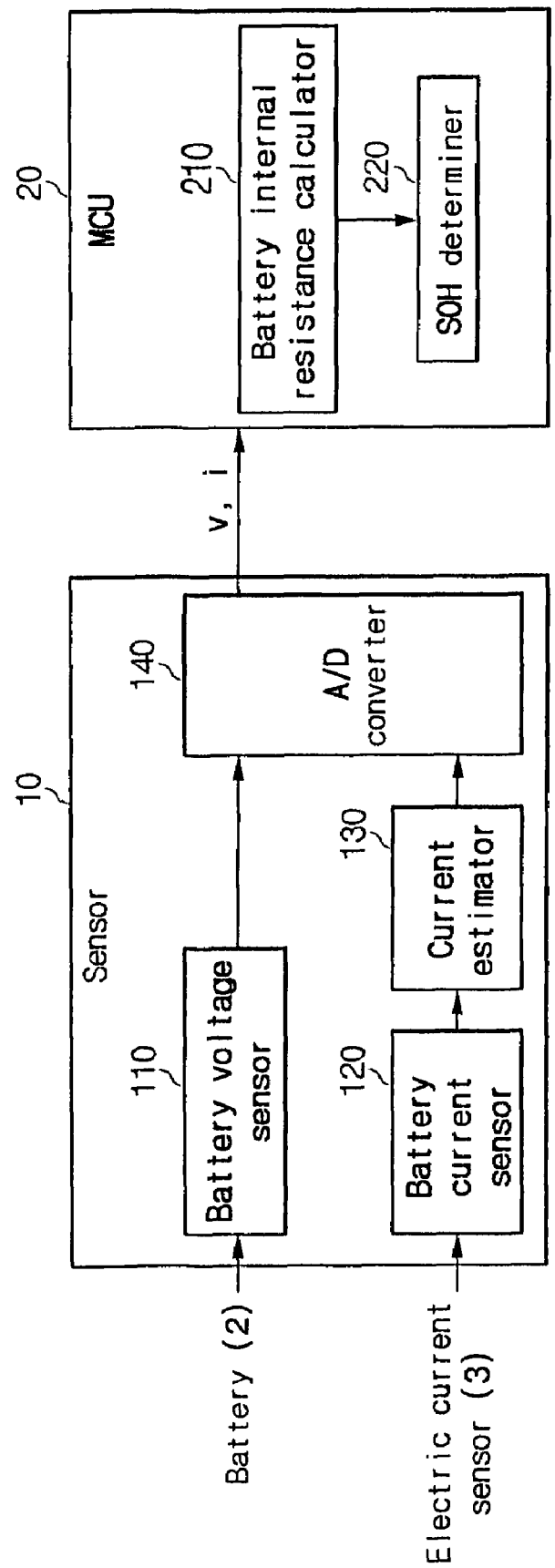
FIG. 2 is a schematic diagram illustrating the sensor and the micro control unit (MCU) of FIG. 1 according to an exemplary embodiment of the present invention.
Figure 3:
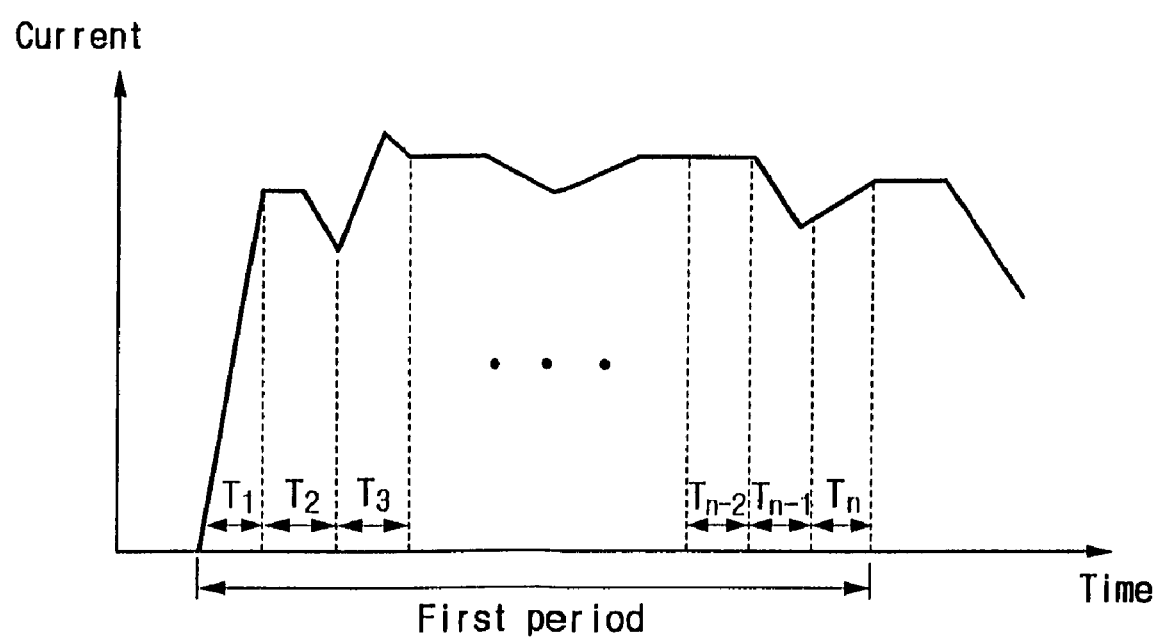
FIG. 3 is a graph for describing the process of calculating an average value of an estimation current of a battery according to an exemplary embodiment of the present invention.

FIG. 2 is a schematic diagram illustrating the sensor and the micro control unit (MCU) of FIG. 1 according to an exemplary embodiment of the present invention, and FIG. 3 is a graph for describing the process of calculating an average value of an estimation current of a battery according to an exemplary embodiment of the present invention. It is shown that the batter is charged for the first period in FIG. 3. But the battery can be discharged for the first period.

As shown in FIG. 2, according to an exemplary embodiment of the present invention, the MCU 20 calculates the internal resistance of the battery 2 using the battery voltage (V) sensed by the sensor 10 and the battery estimation current (i). The sensor 10 includes a battery voltage sensor 110, a battery current sensor 120, an electric current estimator 130, and an analog-to-digital (A/D) converter 140. The MCU 20 includes an internal resistance calculator 210 and an SOH determiner 220.

The battery voltage sensor 110 senses and transmits, to the A/V converter 140, an analog voltage value between the output terminals (2_out1 and 2_out2) of the battery 2.

The battery current sensor 120 receives an electric current value sensed by the current sensor 3, and transmits it to the electric current estimator 130.

The current estimator 130 compares the present battery current, received from the battery current sensor 120, with the reference current. The current estimator 130 cumulatively calculates the deviation of the current based on the comparison result, by a unit of a second period. The current estimator 130 divides the cumulatively calculated current value by the time corresponding to the second period, and generates the estimation current (i) of the battery. According to an exemplary embodiment of the present invention, the reference current is an arbitrarily set electric current that is compared with the presently measured battery current. The reference current can be different depending on the user's setting.

The A/D converter 140 converts analog data, received from the battery voltage sensor 110 and the current estimator 130, into digital data, and transmits the converted digital data to the MCU 20.

A method for calculating the internal resistances of the elements and the battery of the MCU 20 will be described in detail below.

The battery internal resistance calculator 210 receives the battery voltage measured by the sensor 10 soon after the key-on state, and the battery estimation current (i), and sets the received voltage as the battery voltage ($V_1$). The battery internal resistance calculator 210 sets the voltage, received from the sensor 10 after the first period for which the battery is charged, as the battery voltage ($V_2$). Thus, the battery internal resistance calculator 210 calculates the difference ($V_2-V_1$) between the battery voltages ($V_2$) measured after the first period and the battery voltage ($V_1$) of the key-on state. The battery internal resistance calculator 210 calculates the average value ($I_{ave}$) of the estimation current using the battery estimation current (i) of the first period. The process of calculating the average value ($I_{ave}$) of the estimation current of the battery according to an exemplary embodiment of the present invention will be described in detail with reference to FIG. 3.

The battery internal resistance calculator 210 samples the battery estimation current (i) of the first period for which the battery is charged. The battery internal resistance calculator 210 sums up estimation current values corresponding to respective sampling time durations ($T_1$ to $T_n$). The battery internal resistance calculator 210 divides a sum of the estimation currents by the sampling number of times (n), and calculates the average value ($I_{ave}$) of the battery estimation currents of the first period. Thus, the battery internal resistance calculator 210 divides the voltage difference ($V_2-V_1$) of the battery by the average value ($I_{ave}$) of the battery estimation current, and calculates the battery internal resistance using Equation 1 below.

$$Rb = \frac{V_2 - V_1}{I_{ave}} \times 1000 \; [m\Omega] \quad \text{(Equation 1)}$$

where $V_1$ is battery voltage in the key-on state, $V_2$ is battery voltage after first period for which battery is charged, and $I_{ave}$ is average value of estimation current of the first period for which battery is charged.

The battery internal resistance calculator 210 transmits the calculated internal resistance of the battery to the SOH determiner 220. According to an exemplary embodiment of the present invention, the internal resistance of the battery has a unit of milliohms (mΩ) because the amount of variation of the battery voltage is very small in magnitude compared to the magnitude of the battery current, but it is not intended to limit the scope of the present invention. The resistance unit used in the above equation can vary depending on the amount of variation of the battery voltage and current.

The SOH determiner 220 determines the SOH using the battery internal resistance. The SOH determiner 220 receives the battery internal resistance from the battery internal resistance calculator 210, and compares the received internal resistance with a reference resistance. When the battery internal resistance is greater than the reference resistance, the SOH determiner 220 determines that the SOH of the battery is low, and that the lifespan of the battery has expired. However, when the battery internal resistance is less than the reference resistance, the SOH determiner 220 determines that the SOH of the battery is high, and the lifespan of the battery is in a normal range. According to an exemplary embodiment of the present invention, the reference resistance can be the battery internal resistance when the battery in use provides an output which is 80% of the output of a fresh battery. However, it is not intended to limit the scope of the present invention, and the reference resistance can be different depending on the user's setting.

Figure 4:
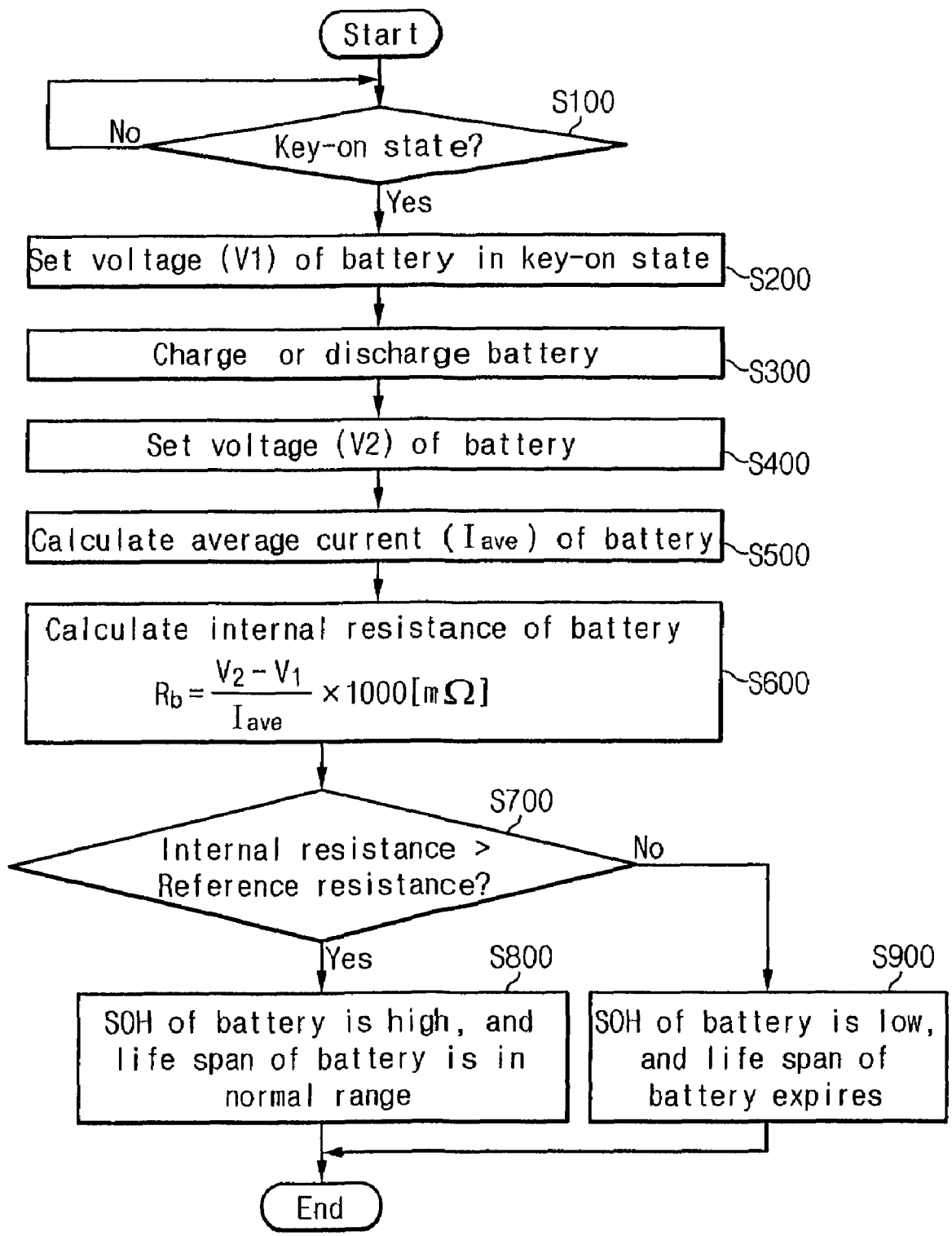
FIG. 4 is a flowchart illustrating a method for calculating an internal resistance of a battery according to an exemplary embodiment of the present invention.

FIG. 4 is a flowchart illustrating the method for calculating the internal resistance of the battery according to an exemplary embodiment of the present invention.

A determination as to whether or not the MCU 20 is in a key-on state is made (S100).

When it is determined in step S100 that the MCU 20 is not in the key-on state, step S100 is repeated. When it is determined in step S100 that the MCU 20 is in the key-on state, the MCU 20 sets the voltage received from the sensor 10 in the key-on state as the battery voltage ($V_1$) (S200). The battery is charged or discharged during the first period ($V_1$) (S300).

After the first period for which the battery is charged or discharged, the MCU 20 sets the voltage received from the sensor 10 as the battery voltage ($V_2$) (S400). Then, the MCU 20 calculates the difference ($V_2-V_1$) between the battery voltage ($V_2$) and the battery voltage ($V_1$) of the key-on state. The MCU 20 samples the battery estimation current (i) during the first period, and sums up the estimation current values corresponding to the respective sampling time durations ($T_1$ to $T_n$). The MCU 20 divides the sum of the estimation currents by the sampling number of times (n), and calculates the average value ($I_{ave}$) of the battery estimation current of the first period (S500).

Upon completion of the calculation of the average value ($I_{ave}$) of the battery estimation current in step S500, the MCU 20 divides the voltage difference ($V_2-V_1$) by the average value ($I_{ave}$) of the battery estimation current, and calculates the battery internal resistance using Equation 1 which is repeated below.

$$Rb = \frac{V_2 - V_1}{I_{ave}} \times 1000 \; [m\Omega] \quad \text{(Equation 1)}$$

The MCU 20 compares the calculated internal resistance of step S600 with the reference resistance (S700).

When the calculated battery internal resistance is less than the reference resistance as a result of the comparison of step S700, the MCU 20 determines that the SOH of the battery is high, and the lifespan of the battery is in the normal range (S800). When the calculated battery internal resistance is greater than the reference resistance as a result of step S700, the MCU 20 determines that the SOH of the battery is low, and that the lifespan of the battery has expired (S900).

As described above, in the method for calculating the battery internal resistance using the average value ($I_{ave}$) of the battery estimation current according to an exemplary embodiment of the present invention, calculation is performed in consideration of the dynamically varying electric current. Therefore, the calculation can be more accurately performed, and thus the lifespan and the SOH of the battery can be more accurately determined in comparison to a conventional method for calculating the internal resistance.

In the battery management system and the driving method thereof according to an exemplary embodiment of the present invention, the internal resistance of the battery can be more accurately calculated using the average value of the estimation current of the battery.

While this invention has been described in connection with what is presently considered to be practical exemplary embodiments, it is to be understood that the invention is not limited to the disclosed embodiments, but, on the contrary, it is intended to cover various modifications and equivalent arrangements included within the spirit and scope of the appended claims.

What is claimed is:

1. A battery management system, comprising:
   a sensor for sensing a voltage and a current of a battery, and for generating an estimation current of the battery using a result of cumulatively calculating the battery current by a unit of a predetermined period; and
   a micro control unit (MCU) for receiving the voltage of the battery and the estimation current of the battery, for setting a voltage of the battery in a key-on state as a first voltage, for setting a voltage of the battery after a first period, which is set according to a condition of controlling a vehicle, as a second voltage, and for calculating an internal resistance of the battery using a difference between the first and second voltages and an average value of the estimation current.

2. The system of claim 1, wherein the estimation current is generated by cumulatively calculating the current of the battery for a unit of a second period, and by dividing the calculated current of the battery by a time corresponding to the second period.

3. The system of claim 2, wherein the MCU samples the estimation current of the first period, and calculates the average value of the estimation current.

4. The system of claim 3, wherein the MCU calculates the internal resistance of the battery using the following equation:

$$Rb = \frac{V_2 - V_1}{I_{ave}} \times 1000 \ [m\Omega]$$

where
$V_1$ is the battery voltage of the battery in the key-on state,
$V_2$ is the voltage of the battery after the first period, and
$I_{ave}$ is the average value of the estimation current of the battery.

5. The system of claim 4, wherein the sensor comprises an electric current estimator for comparing the current of the battery to a reference current to produce a comparison result, for cumulatively calculating a deviation based on the comparison result, for dividing the calculated deviation by the time corresponding to the second period, and for generating the estimation current.

6. A method for driving a battery management system managing a battery, said method comprising the steps of:
   setting a voltage of the battery in a key-on state as a first voltage;
   setting a voltage of the battery after a first period as a second voltage;
   calculating an average value of an estimation current of the battery for the first period; and
   calculating an internal resistance of the battery using a difference between the first and second voltages and the average value of the estimation current.

7. The method of claim 6, wherein the step of calculating the average value of the estimation current of the battery comprises cumulatively calculating a current of the battery for a unit of a second period to produce a calculated result, dividing the calculated result by a time corresponding to the second period, and generating the estimation current of the battery.

8. The method of claim 7, wherein the step of calculating the average value of the estimation current of the battery is performed by sampling the estimation current of the battery for the first period.

9. The method of claim 8, wherein the step of calculating the internal resistance of the battery is performed using the following equation:

$$Rb = \frac{V_2 - V_1}{I_{ave}} \times 1000 \ [m\Omega]$$

where
$V_1$ is the voltage of the battery in the key-on state,
$V_2$ is the voltage of the battery after the first period, and
$I_{ave}$ is the average value of the estimation current of the battery.

10. The method of claim 6, wherein the step of calculating the average value of the estimation current of the battery is performed by sampling the estimation current of the battery for the first period.

11. The method of claim 10, wherein the step of calculating the internal resistance of the battery is performed using the following equation:

$$Rb = \frac{V_2 - V_1}{I_{ave}} \times 1000 \ [m\Omega]$$

where
$V_1$ is the voltage of the battery in the key-on state,
$V_2$ is the voltage of the battery after the first period, and
$I_{ave}$ is the average value of the estimation current of the battery.

12. The method of claim 6, wherein the step of calculating the internal resistance of the battery is performed using the following equation:

$$Rb = \frac{V_2 - V_1}{I_{ave}} \times 1000 \ [m\Omega]$$

where
$V_1$ is the voltage of the battery in the key-on state,
$V_2$ is the voltage of the battery after the first period, and
$I_{ave}$ is the average value of the estimation current of the battery.

* * * * *